United States Patent
Darzy et al.

(10) Patent No.: US 11,863,169 B2
(45) Date of Patent: Jan. 2, 2024

(54) CURRENT-MODE CIRCUITS AND CALIBRATION THEREOF

(71) Applicant: Socionext Inc., Kanagawa (JP)

(72) Inventors: Saul Darzy, Maidenhead (GB); Ozcan Tuncturk, Maidenhead (GB)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 17/850,202

(22) Filed: Jun. 27, 2022

(65) Prior Publication Data

US 2023/0036535 A1 Feb. 2, 2023

(30) Foreign Application Priority Data

Jul. 27, 2021 (EP) .................................... 21188083

(51) Int. Cl.
| | |
|---|---|
| *H03M 1/66* | (2006.01) |
| *H03K 17/687* | (2006.01) |
| *H03M 1/12* | (2006.01) |
| *H03F 3/45* | (2006.01) |

(52) U.S. Cl.
CPC ............ *H03K 17/687* (2013.01); *H03M 1/12* (2013.01); *H03M 1/66* (2013.01); *H03F 3/45071* (2013.01); *H03F 2200/156* (2013.01)

(58) Field of Classification Search
CPC ........ H03K 17/687; H03M 1/12; H03M 1/66; H03F 3/45071; H03F 2200/156
See application file for complete search history.

(56) References Cited

U.S. PATENT DOCUMENTS

| | | | |
|---|---|---|---|
| 5,257,027 A | 10/1993 | Murota | |
| 2004/0239544 A1 | 12/2004 | Li | |
| 2007/0210946 A1 | 9/2007 | Hsieh | |
| 2014/0340150 A1* | 11/2014 | Dempsey | ............ H03F 3/45475 330/260 |
| 2015/0171885 A1 | 6/2015 | Juang et al. | |

FOREIGN PATENT DOCUMENTS

| | | |
|---|---|---|
| EP | 0260095 A1 | 3/1988 |
| EP | 2023487 A1 | 2/2009 |
| EP | 2211468 A1 | 7/2010 |
| EP | 3618282 A1 | 3/2020 |

OTHER PUBLICATIONS

Extended European Search Report dated Jan. 12, 2022 issued in the corresponding European Patent Application No. 21188083.6.
Naylor Jr: "A complete high-speed voltage output 16-bit monolithic DAC", IEEE Journal of Solid-State Circuits, IEEE, USA, vol. 18, No. 6, Dec. 1, 1983 (Dec. 1, 1983), pp. 729-735, XP011422302,ISSN: 0018-9200, DOI:10.1109/JSSC.1983.1052024.

* cited by examiner

*Primary Examiner* — Joseph J Lauture
(74) *Attorney, Agent, or Firm* — Rimon P.C.

(57) ABSTRACT

A current-mode circuit, comprising: at least one switch unit, each switch unit comprising a field-effect transistor connected at its source terminal in series with an impedance and configured to carry a given current, wherein for each switch unit or for at least one of the switch units the impedance is a variable impedance; and an adjustment circuit configured, for each switch unit or for said at least one of the switch units, to adjust an impedance of the variable impedance to calibrate a predetermined property of the switch unit which is dependent on the field-effect transistor.

16 Claims, 12 Drawing Sheets

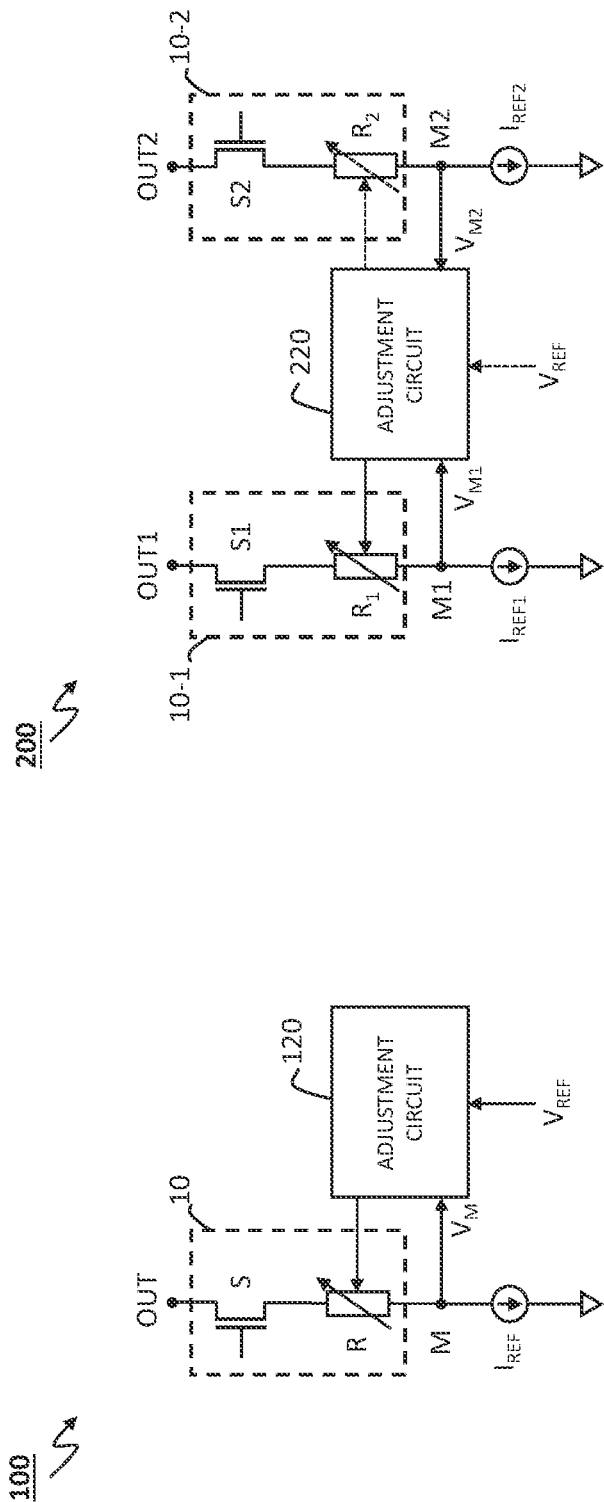

CURRENT-MODE CIRCUITS AND CALIBRATION THEREOF

CROSS-REFERENCE OF RELATED APPLICATIONS

This application claims the benefit of European Patent Application No. 21188083.6, filed on Jul. 27, 2021, the entire disclosure of which Application is incorporated by reference herein.

The present invention relates to current-mode circuits for use, for example, in high-speed digital-to-analogue converters (DACs) or analogue-to-digital converters (ADCs). Such current-mode circuits may be referred to as switching circuits or circuitry. Such circuitry may be implemented as integrated circuitry, for example on an IC chip.

FIG. 1 shows an overview of a previously considered DAC by way of example. The DAC in FIG. 1 is part of a DAC integrated circuit (IC) of the current-steering type, and is designed to convert an m-bit digital input word (D1-Dm) into a corresponding analogue output signal.

Referring to FIG. 1, the DAC 1 contains analogue circuitry including a number n of identical current sources $2_1$ to $2_n$, where $n=2^{m-1}$. Each current source 2 passes a substantially constant current I. The analogue circuitry further includes a number n of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current IA of the DAC 1 is the sum of the respective currents delivered to the first terminals of the differential switching circuit, and a second output current $I_B$ of the DAC 1 is the sum of the respective currents delivered to the second terminals of the differential switching circuit. The analogue output signal is the voltage difference $V_A$-$V_B$ between a voltage $V_A$ produced by sinking the first output current IA of the DAC 1 into a resistance R and a voltage $V_B$ produced by sinking the second output current $I_B$ of the converter into another resistance R.

The thermometer-coded signals T1 to Tn are derived from the binary input word D1-Dm by digital circuitry including a binary-thermometer decoder 6. The decoder 6 operates as follows. When the binary input word D1-Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A$=O and $V_B$=nIR. The analogue output signal $V_A$-$V_B$=−nIR. As the binary input word D1-Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1-Dm has the value i, the first i differential switching circuits $4_1$ to $4_i$ select their respective first terminals, whereas the remaining n−i differential switching circuits $4_{i+1}$ to $4_n$ select their respective second terminals. The analogue output signal $V_A$-$V_B$ is equal to (2i−n)IR.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

An exemplary differential switching circuit (or current-mode circuit) suitable for use with the DAC of FIG. 1 is shown in FIG. 2. This differential switching circuit comprises first and second PMOS field-effect transistors (FETs) S1 and S2. The respective sources of the transistors S1 and S2 are connected to a common node TAIL to which a corresponding current source ($2_1$ to $2_n$ in FIG. 1) is connected. The respective drains of the transistors S1 and S2 are connected to respective first and second output nodes OUTA and OUTB of the circuit which correspond respectively to the first and second terminals of each of the differential switching circuits shown in FIG. 1.

Each transistor S1 and S2 has a corresponding driver circuit $8_1$ or $8_2$ connected to its gate. Complementary input signals IN and INB are applied respectively to the inputs of the driver circuits $8_1$ and $8_2$. Each driver circuit buffers and inverts its received input signal IN or INB to produce a switching signal SW1 or SW2 for its associated transistor S1 or S2 such that, in the steady-state condition, one of the transistors S1 and S2 is on and the other is off. For example, as indicated in FIG. 2, when the input signal IN has the high level (H) and the input signal INB has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node TAIL is passed to the output node OUTA and no current passes to the output node OUTB.

When it is desired to change the state of the circuit of FIG. 2 so that the transistor S1 is OFF and the transistor S2 is ON, complementary changes are made simultaneously in the input signals IN and INB such that the input signal IN changes from H to L at the same time as the input signal INB changes from L to H. As a result of these complementary changes the transistor S1 turns OFF and the transistor S2 turns ON, so that all of the input current flowing into the common node TAIL is passed to the output node OUTB and no current passes to the output node OUTA.

In a differential switching circuit of a high-speed DAC the transistors S1 and S2 are required to switch from OFF to ON and vice versa very quickly. To achieve rapid switching, it is necessary for the transistors to be made as small as possible. However, although making the transistors as small as possible minimises their switching delays, it is found that the mismatch in switching delay from one transistor to another increases. Put another way, it is found that there may be a mismatch in the switching delay of a given transistor relative to a reference switching delay.

It is desirable to address one or more of the above problems, and in particular to provide current-mode circuits (sampling switch circuits) which have improved performance for example at higher speeds of operation.

According to an embodiment of a first aspect of the present invention, there is provided a current-mode circuit, comprising: at least one switch unit, each switch unit comprising a field-effect transistor connected at its source terminal in series with an impedance and configured to carry a given current, wherein for each switch unit or for at least one of the switch units the impedance is a variable impedance; and an adjustment circuit configured, for each switch unit or for said at least one of the switch units, to adjust an impedance of the variable impedance to calibrate a predetermined property of the switch unit (which is) dependent on the field-effect transistor.

In this way, the effect of any mismatch of the field-effect transistor S (relative to a reference field-effect transistor—not shown) on the predetermined property may be at least partially calibrated out. Such calibration may for example at least partially serve as switching delay calibration. Such calibration may also be of particular use where the field-effect transistor S is a FinFET, i.e., a fin field-effect transistor.

For each switch unit or for said at least one of the switch unit: the variable impedance may comprise a first resistor connected in parallel with a second resistor, the second resistor being a variable resistor; and the adjustment circuit may be configured to adjust the resistance of the variable resistor to calibrate the predetermined property.

For each switch unit or for said at least one of the switch units: the first resistor may comprise a polysilicon resistor or a diffusion resistor, and optionally is a fixed-resistance resistor; and/or the variable resistor may comprise a calibration transistor (such as a field-effect transistor).

The first resistor may have a resistance of X ohms and the second resistor may be controllable to have a resistance within a defined range of resistances. A mid-range resistance of the defined range of resistances may be Y ohms, where $5 \leq Y/X \leq 20$, or where $10 \leq Y/X \leq 14$. The range of resistances may be approximately from 5.X ohms to 25.X ohms, or approximately from 6.X ohms to 20.X ohms.

For each switch unit or for said at least one of the switch units: the adjustment circuit may comprise a digital-to-analogue converter connected to control the variable resistor dependent on a digital input signal; and the adjustment circuit may be configured to control the digital input signal for the digital-to-analogue converter concerned to adjust the resistance of the variable resistor.

The adjustment circuit may be configured to: for each switch unit, measure the predetermined property; and for each switch unit or for said at least one of the switch units, adjust the impedance of the variable impedance so as to adjust the measured property to or towards a reference value. In this way, the predetermined property may be calibrated. As a result, other properties such as switching delay may be controlled.

For each switch unit: the given current may have a defined value; and the predetermined property may be a potential difference comprising a sum of its gate-source voltage and a potential difference across its series-connected impedance, optionally when the field-effect transistor is provided with a gate voltage having a defined ON voltage level to turn it ON.

For each switch unit, the field-effect transistor and the impedance may be further connected in series with a current source in that order, the current source defining the given current, a node between the variable impedance and the current source being a measurement node, and a voltage at the measurement node being a measurement voltage. The adjustment circuit may comprise a comparator configured, for each switch unit or for said at least one of the switch units, to compare the measurement voltage with a reference voltage, and may be configured to adjust the impedance of the variable impedance concerned based on the comparison to bring the measurement voltage into or towards a target relationship with the reference voltage.

For each switch unit or for said at least one of the switch units, the target relationship may be that a ratio between the measurement voltage and the reference voltage is substantially a predetermined ratio and/or that the measurement voltage and the reference voltage are substantially equal.

The current-mode circuit may comprise a plurality of switch units. As one example, the reference voltage may be the same for all of the switch units, and the adjustment circuit may be configured, for each switch unit, to adjust the impedance of the variable impedance concerned based on the comparison to bring the measurement voltage into or towards the target relationship with the reference voltage. As another example, the reference voltage for said at least one of the switch units may be the measurement voltage for another one of the switch units, and the adjustment circuit may be configured, for said at least one of the switch units, to adjust the impedance of its variable impedance based on the comparison to bring its measurement voltage into or towards the target relationship with its reference voltage.

The adjustment circuit may be configured to control the gate voltages of the field-effect transistors to selectively have ON voltage levels to selectively turn them ON to carry their given currents. The given currents and/or the ON voltage levels may be the same for all of the switch units.

The respective measurement nodes may be connected together to form a shared measurement node. A shared current source may be connected to the shared measurement node. The adjustment circuit may be configured: to control the gate voltages of the field-effect transistors to turn them ON one-by-one in turn so that the shared current source defines the given current for the switch unit whose field-effect transistor is ON; and whilst the field-effect transistor for each switch unit or for said at least one of the switch units is ON, to adjust the impedance of the variable impedance of that switch unit.

According to an embodiment of a second aspect of the present invention, there is provided a digital-to-analogue converter or an analogue-to-digital converter, comprising a current-mode circuit according to the aforementioned first aspect of the present invention.

According to an embodiment of a third aspect of the present invention, there is provided integrated circuitry, such an IC chip, comprising a current-mode circuit according to the aforementioned first aspect of the present invention, or a digital-to-analogue converter or an analogue-to-digital converter according to the aforementioned second aspect of the present invention.

The present disclosure corresponds to method aspects (e.g. methods of controlling current-mode circuits) corresponding to the above apparatus aspects, respectively.

Reference will now be made, by way of example, to the accompanying drawings, of which:

FIG. 1, as mentioned above, is schematic diagram of a previously considered DAC;

FIG. 2, as mentioned above, is a schematic diagram of a differential switching circuit for use with the DAC of FIG. 1;

FIG. 3A is a schematic diagram of a current-mode circuit embodying the present invention;

FIG. 3B is a schematic diagram of another current-mode circuit embodying the present invention;

Figure 2:
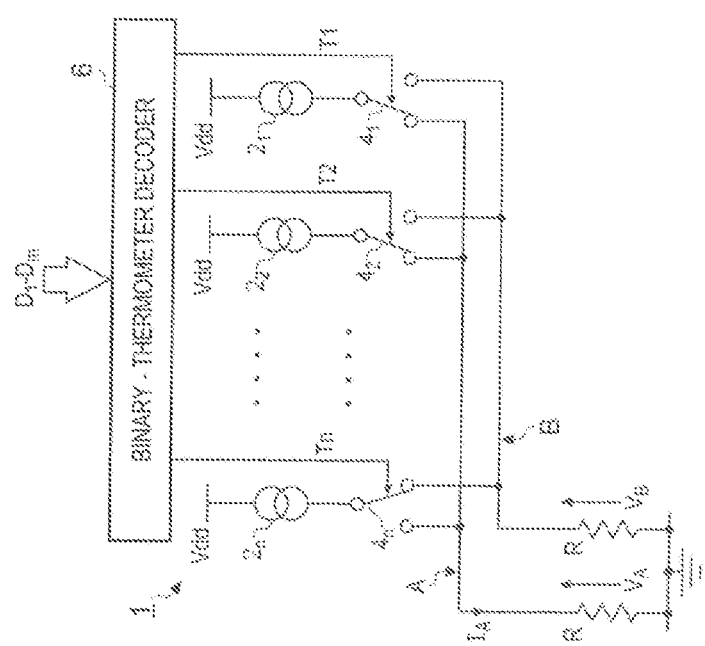

Embodiments of the present invention seek to address the above problems.

FIG. 3A is a schematic diagram of a current-mode circuit 100 embodying the present invention. The current-mode circuit 100 comprises a switch unit 10, an adjustment circuit 120 and a current source $I_{REF}$.

As shown, the switch unit 10 comprises a field-effect transistor S (which may be considered a switch) connected at its source terminal in series with an impedance R and configured to carry a given current, here labelled $I_{REF}$. The impedance R is a variable impedance.

The adjustment circuit 120 is configured to adjust an impedance of the variable impedance R to 'calibrate out' the effect of any mismatch of the field-effect transistor S (relative to a reference field-effect transistor—not shown) on a predetermined property of the switch unit 10 which is dependent on the field-effect transistor S. The predetermined property is a property of the switch unit 10 which is dependent on the physical configuration of the field-effect transistor S for example as determined by its manufacture, including the dimensions of the field-effect transistor S, its threshold voltage and/or saturation current $I_{SS}$. The adjustment circuit 120 is configured to measure the predetermined property and adjust the impedance of the variable impedance R so as to adjust the measured property to or towards a reference value.

By 'calibrating out' the effect any such mismatch on the predetermined property, a switching delay of the field-effect transistor S may be at least partly calibrated.

In the case of the current-mode circuit 100, the predetermined property for the switch unit 10 is a potential difference comprising a sum of its gate-source voltage and a potential difference across its series-connected impedance R when the field-effect transistor S is provided with a gate voltage having a defined ON voltage level to turn it ON.

The field-effect transistor S and the impedance R are further connected in series with the current source in that order, as shown, the current source defining the given current $I_{REF}$. The current source defining the given current $I_{REF}$ is labelled $I_{REF}$ (i.e. in the same way as the current it provides) for convenience, and current sources herein will be labelled in a similar manner. In some arrangements the given current $I_{REF}$ may be a calibrated current or have been pre-calibrated against a calibrated current $I_{CAL}$.

A node M between the variable impedance R and the current source $I_{REF}$ is a measurement node, and a voltage at the measurement node is a measurement voltage $V_M$. The adjustment circuit 120 comprises a comparator (not shown) configured to compare the measurement voltage $V_M$ with a reference voltage $V_{REF}$, and is configured to adjust the impedance of the variable impedance R concerned based on the comparison to bring the measurement voltage $V_M$ into or towards a target relationship with the reference voltage $V_{REF}$. The target relationship is that the measurement voltage $V_M$ and the reference voltage $V_{REF}$ are substantially equal, but may comprise a target ratio between those voltages (other than that they are equal).

In this way, the predetermined property of the switch unit 10 may be calibrated to a reference value (effectively defined by the reference voltage $V_{REF}$).

Although only one switch unit 10 is shown in FIG. 3A, it may be that more than one switch unit 10 is provided. The current-mode circuit 100 may be considered to comprise at least one switch unit 10, wherein for each switch unit 10 or for at least one of the switch units 10 the impedance R is a variable impedance. In that case, the adjustment circuit 120 may be configured, for each switch unit 10 or for the at least one of the switch units 10 having the variable impedance $R_1$ to adjust an impedance of the variable impedance R to calibrate the predetermined property of the switch unit 10 concerned in a similar manner as described above.

FIG. 3B is a schematic diagram of a current-mode circuit 200 embodying the present invention. The current-mode circuit 200 comprises a first switch unit 10-1, a second switch unit 10-2, an adjustment circuit 220 and current sources $I_{REF1}$ and $I_{REF2}$. The switch units 10-1 and 10-2 correspond to the switch unit 10, and the adjustment circuit 220 corresponds to the adjustment circuit 120, and are thus denoted by similar reference signs.

As shown, the switch unit 10-1 comprises a field-effect transistor S1 (which may be considered a switch) connected at its source terminal in series with an impedance $R_1$ and configured to carry a given current, here labelled $I_{REF1}$. Similarly, the switch unit 10-2 comprises a field-effect transistor S2 (which may be considered a switch) connected at its source terminal in series with an impedance $R_2$ and configured to carry a given current, here labelled $I_{REF2}$.

For each switch unit or for at least one of the switch units the impedance is a variable impedance. To illustrate this, the impedance $R_1$ is shown as a variable impedance and the impedance $R_2$ is shown as optionally being a variable impedance (i.e., in some arrangements the impedance $R_2$ may have a fixed impedance).

The adjustment circuit 220 is configured, for each switch unit or for the at least one of the switch units having the variable impedance, to adjust an impedance of the variable impedance to calibrate the predetermined property of the switch unit. To illustrate this, the adjustment circuit 220 is shown as controlling the impedance of the impedance $R_1$ and optionally controlling the impedance of the impedance $R_2$.

As with FIG. 3A, the field-effect transistor S1 and the impedance $R_1$ are further connected in series with a current source $I_{REF1}$ in that order, the current source $I_{REF1}$ defining the given current $I_{REF1}$. A node M1 between the variable impedance $R_1$ and the current source $I_{REF1}$ is a measurement node, and a voltage at the measurement node is a measurement voltage $V_{M1}$. Similarly, the field-effect transistor S2 and the impedance $R_2$ are further connected in series with a current source $I_{REF2}$ in that order, the current source $I_{REF2}$ defining the given current $I_{REF2}$. A node M2 between the variable impedance $R_2$ and the current source $I_{REF2}$ is a measurement node, and a voltage at the measurement node is a measurement voltage $V_{M2}$.

The adjustment circuit 220 comprises a comparator (not shown) configured, for each switch unit 10-1, 10-2 to compare the measurement voltage $V_{M1}$, $V_{M2}$ with a reference voltage, and is configured to adjust the impedance of the variable impedance concerned based on the comparison to bring the measurement voltage into or towards a target relationship (defined similarly as before) with the reference voltage.

The reference voltage may be an externally provided reference voltage $V_{REF}$ (as indicated) which is the same for both (or all) of the switch units 10-1, 10-2. In such a case, the adjustment circuit 220 may be configured, for each switch unit 10-1, 10-2, to adjust the impedance of the variable impedance concerned $R_1$, $R_2$ based on the comparison to bring the measurement voltage $V_{M1}$, $V_{M2}$ into or towards the target relationship with the reference voltage $V_{REF}$.

However, as indicated in FIG. 3B, it is not essential that an external reference voltage $V_{REF}$ be provided, and to illustrate this the external reference voltage $V_{REF}$ is indicated as optional. For example, the reference voltage for one of the switch units may be the measurement voltage for the other (or another) one of the switch units. As an example, it may be that the reference voltage for the switch unit 10-1 is the measurement voltage $V_{M2}$. In this case, the adjustment circuit 220 may be configured, for the switch unit 10-1, to adjust the impedance of its variable impedance $R_1$ based on the comparison to bring its measurement voltage $V_{M1}$, into or towards the target relationship with its reference voltage $V_{M2}$. If the target relationship is that the voltages $V_{M1}$, and $V_{M2}$ are equal, and the currents $I_{REF1}$ and $I_{REF2}$ are equal, along with the gate voltages provided to the switches S1 and S2, and the configurations (e.g., sizes) of the field-effect transistors S1 and S2, it can be seen that in this way the predetermined property of the switch unit 10-1 may be calibrated to be substantially the same as the predetermined property of the switch unit 10-2. That is, the effect of mismatch (threshold voltage mismatch) between the field-effect transistors S1 and S2, including switching delay mismatch, may be substantially reduced or compensated for.

Incidentally, although in FIG. 3B each of the switch units 10-1, 10-2 is provided with its own current source $I_{REF1}$, $I_{REF2}$, it may be that the measurement nodes M1 and M2 are connected together to form a common measurement node M (not shown), which may be considered a tail node and compared with the common node TAIL in FIG. 2. In such a case, the given current may be provided by a common current source $I_{REF}$ (not shown), and the field-effect transistors S1, S2 controlled (by their gate voltages) so that when one of them is ON the other of them is OFF, and vice versa.

Thus, the adjustment circuit 220 may be configured to control the gate voltages of the field-effect transistors S1, S2 to turn them ON one-by-one in turn so that the shared current source $I_{REF}$ (not shown) defines the given current for the switch unit 10-1, 10-2 whose field-effect transistor S1, S2 is ON. Further, the adjustment circuit 220 may be configured, whilst a given field-effect transistor S1, S2 is ON, to adjust the impedance of the variable impedance $R_1$, $R_2$ of that switch unit 10-1, 10-2. The adjustment circuit 220 may be configured to control the gate voltages of the field-effect transistors S1, S2 to have an ON voltage level to selectively turn them ON to carry their given current, and the ON voltage level may be the same for both of the switch units 10-1, 10-2.

Figure 1:
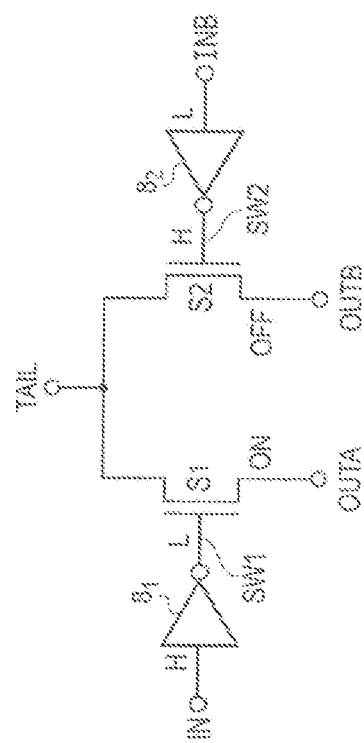

Indeed, although not shown in FIG. 3A, another switch unit 10 may be provided connected to the measurement node M so that one of the field-effect transistors S may be ON when the other of them is OFF, and vice versa. In this regard, both of the current-mode circuits 100 and 200 may be compared with the differential switching circuit (or current-mode circuit) of FIG. 2, i.e. and be considered suitable for use with the DAC of FIG. 1 in a similar way. To aid in this comparison, first and second output nodes OUT1 and OUT2 are indicated at the drain terminals of the field-effect transistors S1 and S2 in FIG. 3B, and may be compared with OUTA and OUTB in FIG. 2. For consistency, an output node OUT is indicated at the drain terminal of the field-effect transistor S in FIG. 3A.

The impedances R, $R_1$, $R_2$ of FIGS. 3A and 3B may comprise or be resistances (or resistors). Although the impedances R, $R_1$, $R_2$ of FIGS. 3A and 3B may additionally or alternatively comprise capacitances and/or inductances, for simplicity they will be considered as resistances going forwards.

Figure 4:
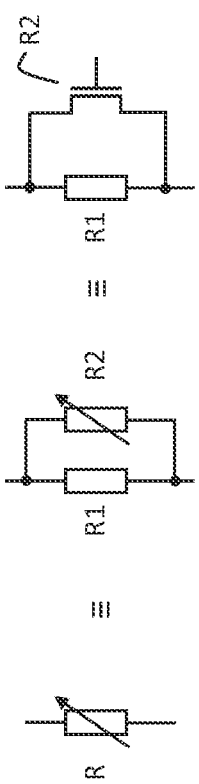
FIG. 4 is a schematic diagram indicating how the impedances R, $R_1$, $R_2$ of FIGS. 3A and 3B may be implemented as a variable impedance.

FIG. 4 is a schematic diagram indicating how the impedance R may be implemented as a variable impedance. Similar considerations of course apply to the impedance $R_1$ and also $R_2$ (when it is a variable impedance). As on the left-hand side, the impedance R may be implemented as variable resistor, and, as in the centre, as a first resistor $R_1$ in parallel with a second resistor R2 where at least the second resistor R2 is a variable resistor. That is, the first resistor R1 may be a fixed-resistance resistor. In the context of integrated circuitry, the first resistor R1 may comprise a polysilicon resistor or a diffusion resistor. The second resistor R2, as on the right-hand side, may be implemented as a transistor, such as a field-effect transistor. The gate voltage of the field-effect transistor R2 may be controlled to control its on-resistance.

Merely as an example, the first resistor R1 may be a polysilicon resistor having a resistance of 50 ohms and the second resistor R2 may be implemented as a field-effect transistor having an on-resistance which is variable across the range 300 ohms to 1000 ohms. This would enable the resistance of the impedance R to be varied between approximately 43 and 48 ohms.

More generally, the first resistor R1 may have a resistance of X ohms and the second resistor R2 may be controllable to have a resistance within a defined range of resistances. A mid-range resistance of the defined range of resistances may be Y ohms, where $5 \le Y/X \le 20$, or where $10 \le Y/X \le 14$. The range of resistances may be approximately from 5.X ohms to 25.X ohms, or approximately from 6.X ohms to 20.X ohms. Of course, increasing the resistance R increases the associated capacitance which will detrimentally affect the switching speed of the associated field-effect transistor S. Also, limiting the range of resistance R limits the calibration range.

The adjustment circuits 120, 220 of FIGS. 3A and 3B may comprise digital units or engines (not shown) and, for each impedance R, $R_1$, $R_2$ which is a variable impedance, a digital-to-analogue converter (not shown) connected to control the impedance dependent on a digital input signal. The adjustment circuits 120, 220 may then be configured to control the digital input signals for the digital-to-analogue converters concerned to adjust the impedances. For example, in the case of the right-hand implementation of FIG. 4, the digital-to-analogue converter may control the gate voltage of the transistor R2.

Looking back to FIGS. 3A and 3B, it will be appreciated that the use of the impedances R in the switch units 10 enables calibration of the switch units 10 (having the field-effect transistors or switches S) without for example needing to calibrate a gate or bulk voltage. This technique may have particular application where the field-effect transistors S are FinFET transistors, i.e. fin field-effect transistors. In particular, the voltage-controlled resistors (see R1, R2 in FIG. 4, where R2 is a FET) enable a combination of a fixed 'poly' resistor R1 in parallel with an NMOS switch R2 to be used to calibrate the switch units 10 even in the case of FinFETs, to compensate for Vth (threshold voltage) mismatch. The NMOS switch R2 on-resistance Ron may be much higher than the resistance of the poly resistor R1 and this enables it to compensate for Ron variations due to temperature variations with sufficient calibration range.

Figure 5:
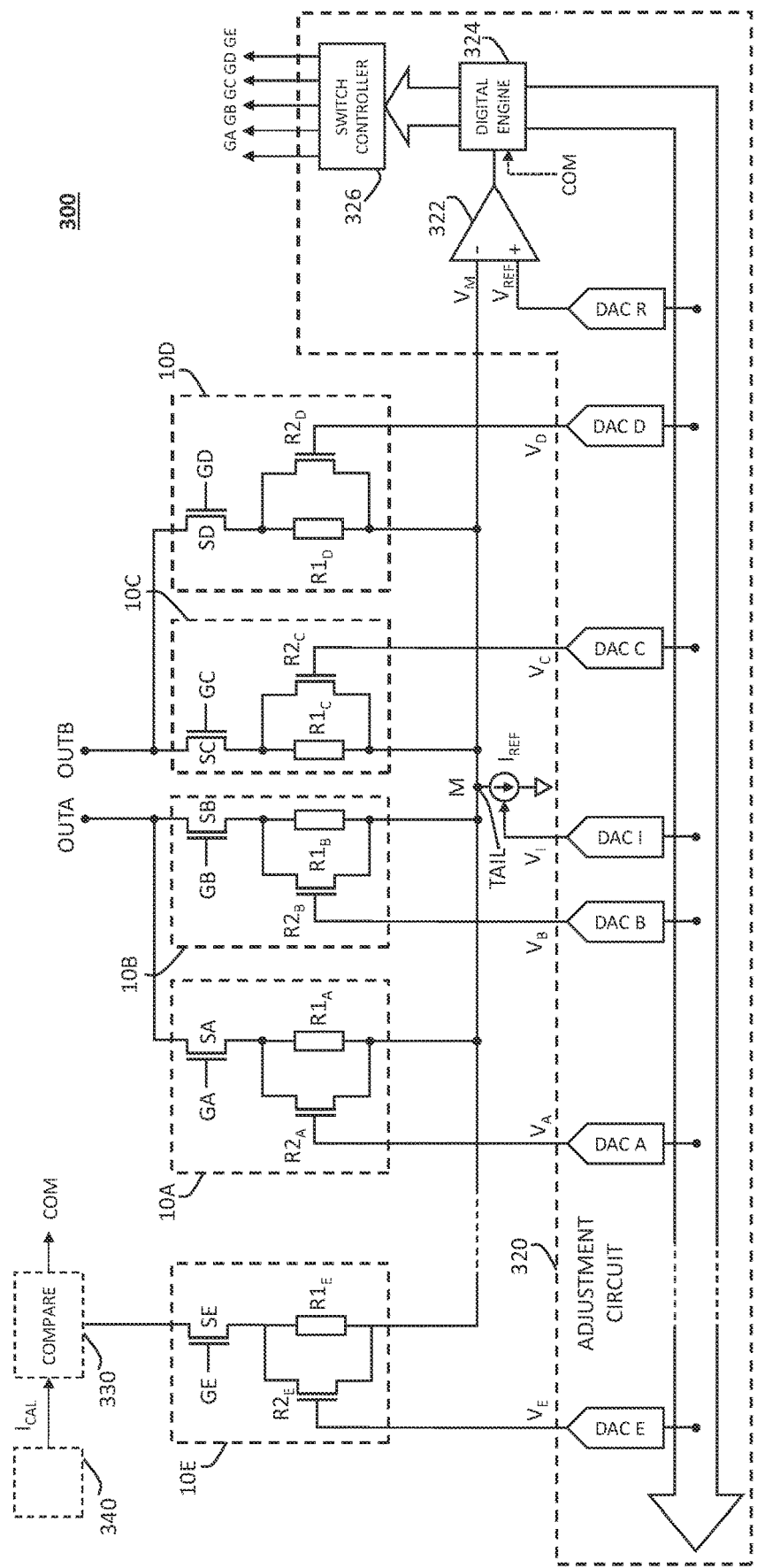
FIG. 5 is a schematic diagram of another current-mode circuit embodying the present invention.

FIG. 5 is a schematic diagram of a current-mode circuit 300 embodying the present invention, being an expanded implementation of the current-mode circuits 100 and 200. The current-mode circuit 300 comprises first to fourth switch units 10A, 10B, 10C and 10D, an optional fifth switch unit 10E, an adjustment circuit 320 and a shared current source $I_{REF}$. Looking back to FIG. 3A, the switch units 10A to 10E correspond to the switch unit 10, the adjustment circuit 320 corresponds to the adjustment circuit 120, and the shared current source $I_{REF}$ corresponds to the current source $I_{REF}$, are thus denoted by similar reference signs.

For consistency with the switch unit 10 of FIG. 3A, the switch unit 10A comprises a field-effect transistor SA connected at its source terminal in series with a variable impedance $R1_A$, $R2_A$. In line with FIG. 4, the variable impedance is implemented as a first resistor $R1_A$ in parallel with a second resistor $R2_A$ with the first resistor $R1_A$ implemented as a polysilicon resistor (of fixed resistance) and the second resistor $R2_A$ implemented as a transistor. The field-effect transistor SA and the variable impedance $R1_A$, $R2_A$ are further connected in series with the shared current source $I_{REF}$ which provides a defined current $I_{REF}$, via a shared measurement node M.

The switch units 10B, 10C, 10D, and 10E are each configured in the same way as the switch unit 10A, with like elements denoted in the same way but with the suffix A replaced with B, C, D or E depending on the switch unit. As such, duplicate description is omitted. All of the switch units 10A, 10B, 10C, 10D, and 10E share the shared measurement node M and the shared current source $I_{REF}$, so that the shared measurement node M may be considered a tail node comparable to the common node TAIL in FIG. 2.

First and second output nodes OUTA and OUTB are provided, for comparison with FIG. 2. The output node OUTA is connected to the drain terminals of the field-effect transistors SA and SB, and the output node OUTB is connected to the drain terminals of the field-effect transistors SC and SD. The shared current source $I_{REF}$ is connected between the shared measurement node M and ground GND.

The adjustment circuit 320 comprises a comparator 322, a digital engine (digital circuit or digital unit) 324, a switch controller 326 and DACs A to E corresponding to the switch units 10A to 10E, respectively. The DACs A to E are configured to output voltage signals $V_A$ to $V_E$, respectively, under control by the digital engine 324. The voltage signals $V_A$ to $V_E$ control the second resistors $R2_A$ to $R2_E$ (implemented as field-effect transistors), respectively, to control their on-resistances. The switch controller 326 is configured to output gate (voltage) signals GA to GE, for controlling the gate terminals of the field-effect transistors SA to SE, respectively, under control by the digital engine 324. It is recalled that the switch unit 10E is optional, and thus the DAC E, voltage signal $V_E$ and gate signal GE may be considered similarly optional.

The adjustment circuit 320 further comprises DACs I and R, corresponding to the shared current source $I_{REF}$ and the comparator 322, respectively.

The DAC I is configured to output a voltage signal $V_I$ to control the shared current source $I_{REF}$ and thus a value of the given current $I_{REF}$. As will become apparent, in some arrangements the shared current source $I_{REF}$ may be configured to provide the given current $I_{REF}$ having a default (and non-variable) value, in which case the DAC I need not be provided.

The DAC R is configured to output a reference voltage signal $V_{REF}$ to be provided to one of the input terminals of the comparator 322, with the other input terminal of the comparator 322 connected to receive a measurement voltage $V_M$ provided at the shared measurement node M. As will become apparent, in some arrangements the comparator 322 may be provided with a reference voltage $V_{REF}$ having a default (and non-variable) value, in which case the DAC R also need not be provided.

Also indicated in FIG. 5 are optional comparator circuitry 330 (marked "Compare") and an optional calibrated current source 340. The calibrated current source 340 provides a calibrated current $I_{CAL}$. The comparator may be considered separate from the adjustment circuit 320 or part of the adjustment circuit 320. As will become apparent, the comparator circuitry 330 may be used to compare the calibrated current $I_{CAL}$ with the given current $I_{REF}$, with an output comparison-result signal COM being used by the digital engine 324 to control the voltage signal $V_I$ and thus adjust (or tune) the given current $I_{REF}$ to become the same (within a degree of accuracy) as the calibrated current $I_{CAL}$. Where the given current $I_{REF}$ is tuned in this way, the switch unit 10E, the DAC E and their associated control signals $V_E$ and GE may be provided.

Operation of the current-mode circuit 300 may be understood in connection with FIGS. 6 to 10.

Figure 6:
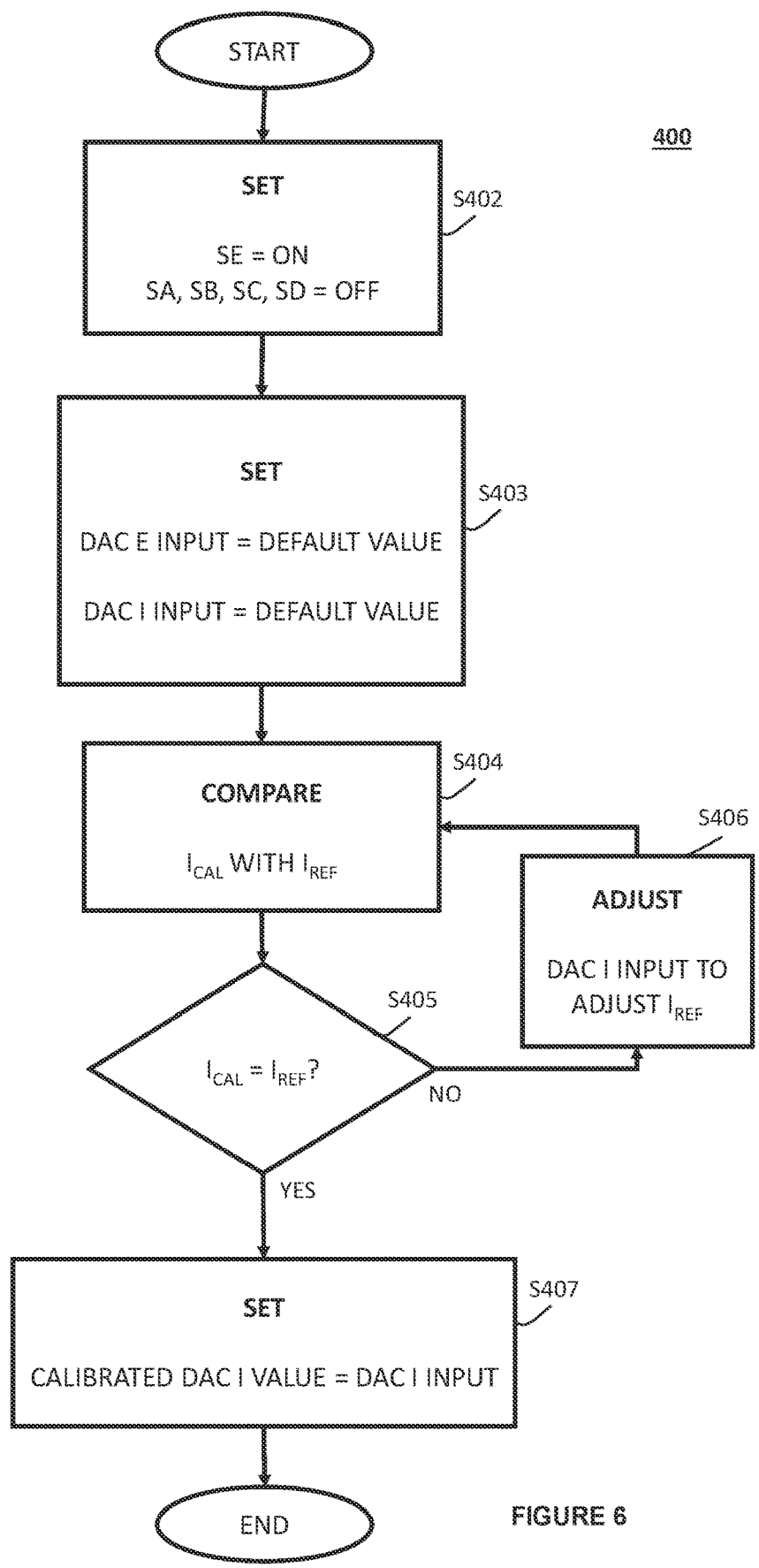
FIG. 6 is a flowchart representing a method which may be carried out by the FIG. 5 circuitry.

FIG. 6 is a schematic diagram of a method 400 for use in calibrating the given current $I_{REF}$ to be the same as the calibrated current $I_{CAL}$. Thus, method 400 assumes that the switch unit 10E, the DAC E and their associated control signals $V_E$ and GE are provided. As above, where the shared current source $I_{REF}$ is configured to provide the given current $I_{REF}$ having a default (and non-variable) value, the switch unit 10E, the DAC E and their associated control signals $V_E$ and GE need not be provided, and the method 400 need not be carried out.

Method 400 comprises steps S402, S403, S404, S405, S406 and S407, and may be carried out by the adjustment circuit 320 (and the comparator circuitry 330).

At step S402, the digital engine 324 controls the switch controller 326 to set the gate signals GA to GE such that field-effect transistor SE is ON and field-effect transistors SA to SD are OFF. Thus, the given current $I_{REF}$ is carried by the switch unit 10E.

At step S403, the digital engine 324 provides the DACs E and I with default (digital) values, e.g. midscale values, so that the variable impedance $R1_E$, $R2_E$ adopts a default resistance value and the given current $I_{REF}$ similarly adopts a default value.

At step S404, the comparator circuitry 330 is employed to compare the calibrated current $I_{CAL}$ with the given current $I_{REF}$, as mentioned above, with the output comparison-result signal COM being provided to the digital engine 324 so that it can determine if the calibrated current $I_{CAL}$ is the same as the given current $I_{REF}$. If the calibrated current $I_{CAL}$ is not the same as the given current $I_{REF}$ (S405, NO), the method 400 proceeds to step S406 where the digital engine 324 adjusts the digital value provided to the DAC I, based on the comparison-result signal COM, to bring the given current $I_{REF}$ closer to the calibrated current $I_{CAL}$. Steps S404, S405, NO and S406 are then repeated until the calibrated current $I_{CAL}$ is the same as the given current $I_{REF}$ (S405, YES), for example to one 1LSB change in the DAC I, in which case the method 400 proceed to step S407.

In step S407, the existing digital value provided to the DAC I is set or recorded as being the calibrated DAC I value, i.e. which causes the given current $I_{REF}$ to be the same as the calibrated current $I_{CAL}$.

Figure 7:
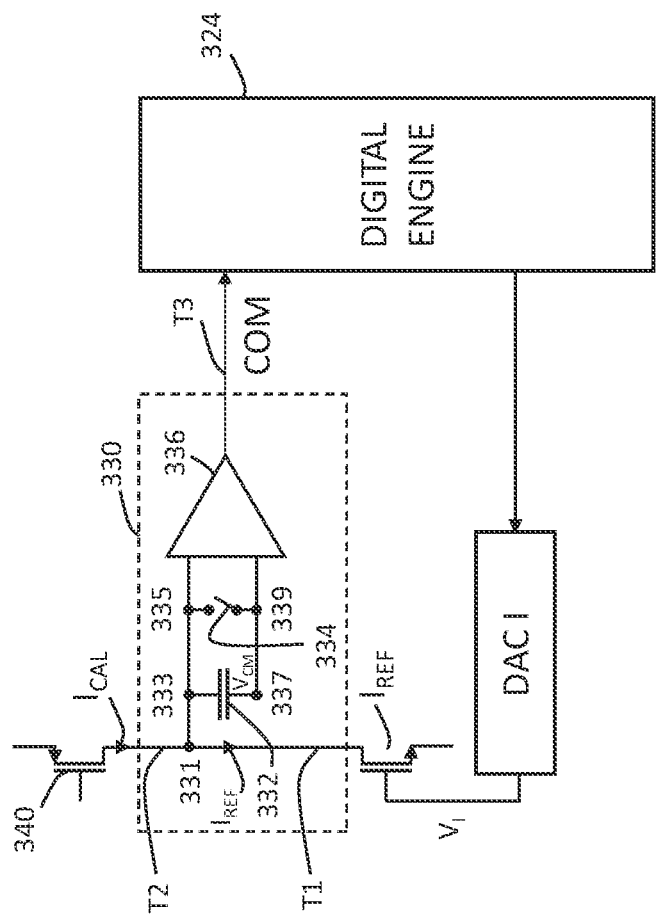
FIG. 7 is a schematic diagram of parts of the current-mode circuit of FIG. 5, presenting an example detailed implementation of its comparator circuitry.

FIG. 7 is a schematic diagram of parts 500 of the current-mode circuit 300 of FIG. 5. In particular, FIG. 7 presents an example detailed implementation of the comparator circuitry 330 to aid in an understanding of the current-mode circuit 300 and the operation of method 400.

Comparator circuitry 330 comprises nodes 331, 333, 335, 337 and 339, a capacitor 332, a switch 334, a comparator 336 and two input terminals T1 and T2. The calibrated current source 340 is shown implemented as a transistor connected to apply the calibrated current $I_{CAL}$ at input T1 and the shared current source $I_{REF}$ is shown implemented as a transistor and connected to apply the given current $I_{REF}$ at the input T2.

Also shown in FIG. 7 is the digital engine 324 connected to receive the signal COM from an output terminal T3 of the comparator circuitry 330 (and of the comparator 336) and to output a digital control signal to the DAC I, which in turn outputs the voltage signal $V_I$ to control the shared current source $I_{REF}$ in line with FIG. 5. It will be understood that the digital engine 324 is also capable of generating other control signals as in FIG. 5, however those other control signals are omitted here for simplicity.

The two inputs T1 and T2 are connected to node 331, which may be considered a test node. The test node 331 is connected to one of the input terminals of the comparator 336 and the nodes 333 and 335, and the other input terminal of the comparator 36 is connected to nodes 337 and 339 and a voltage source (not shown) to maintain that node at a target voltage level (Vcm). The capacitor 332 and the switch 334 are connected in parallel with one another between the two input terminals of the comparator 336, with the capacitor 332 connected between nodes 333 and 337, and the switch 334 connected between nodes 335 and 339.

In operation of the comparator circuitry 330, the switch 334 is turned ON or closed (for example by the digital engine 324 or other control circuitry not shown) which connects the node 335, and therefore the node 331, to the node 339 which is held at the target voltage level (Vcm). Thus, the capacitor 332 is discharged and the test node 331 is biased to the target voltage level (Vcm). The switch 334 is then turned OFF or opened (for example by the digital engine 324 or other control circuitry not shown) and the difference between the currents at T1 and T2 (connected at the node 331) will start integrating over (i.e. charging— positively or negatively) the capacitor 332.

Depending on the difference between the currents at T1 and T2, a voltage at the node 331 will move up or down. After a given test period (a time period chosen to be suitable for the capacitor 332 to be charged to a sufficient extent), the output of the comparator 336 will be high or low depending on the difference between the currents at T1 and T2 (which leads to a difference between the voltages at its two inputs). The comparator 336 thus outputs control signal COM at the output T3 (which is either high or low depending on the difference between the currents at T1 and T2) to the digital engine 324.

The digital engine 324 is configured to receive the control signal COM and to output a digital control signal for causing DAC I to adjust its voltage signal $V_I$ to adjust the given current $I_{REF}$ in line with steps S404, S405 and S406 of FIG. 6. This process may be iterated, for example in a successive approximation way (e.g., binary search). The process may be iterated until the output of the comparator 336 (the control signal COM) changes state (i.e. changes from low to high or vice versa) with one 1LSB change in the DAC I, for example. At that point, the currents at T1 and T2 are deemed to be calibrated to be in a defined relationship with each other (for example equal) to within the required accuracy. For example, the difference between the currents is then less than a threshold current difference.

The test period (the length of time that the capacitor is allowed to charge) can be increased or decreased depending on the desired accuracy/resolution vs. speed of operation of the comparator circuitry 330.

Figure 8:
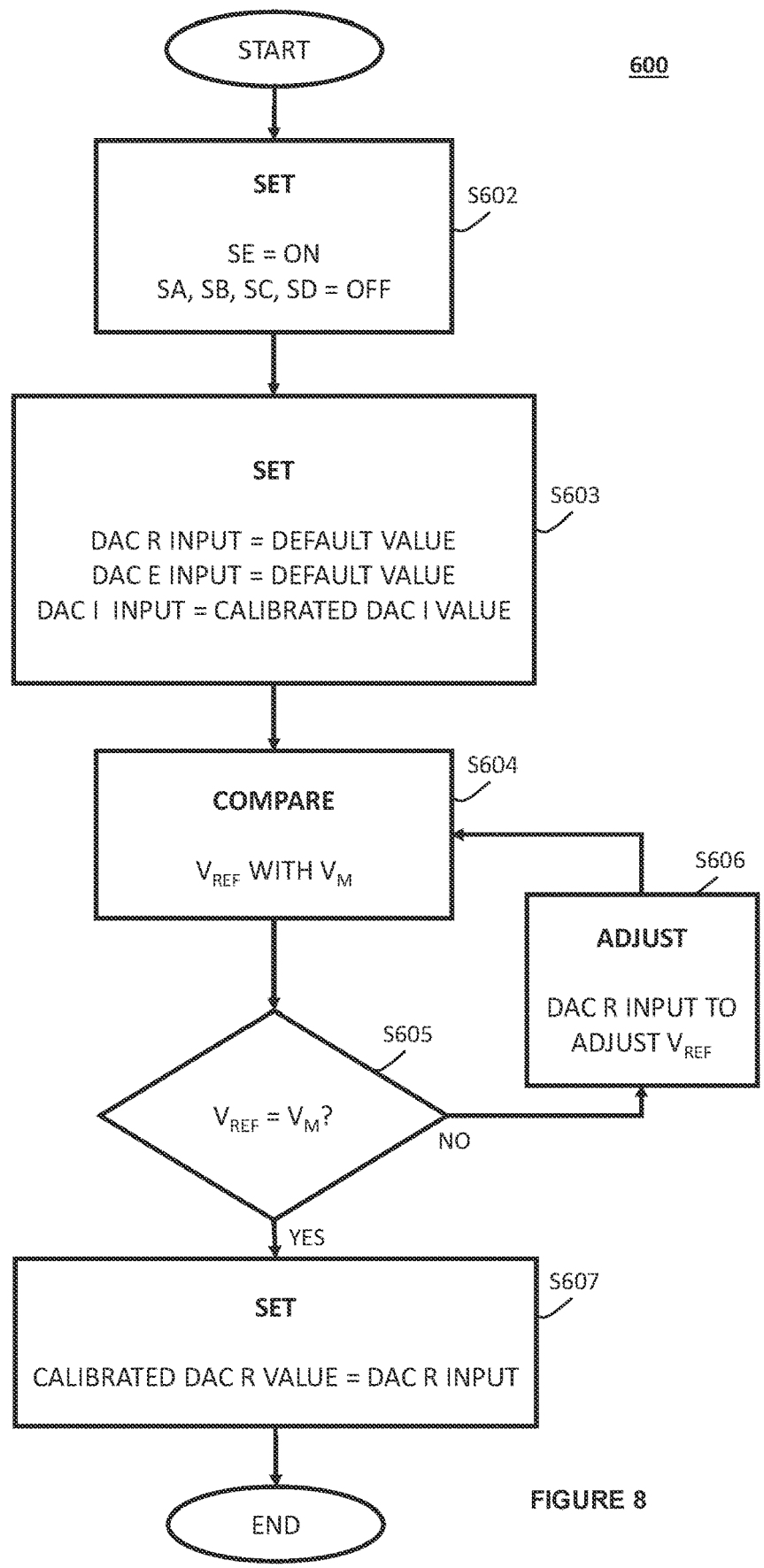
FIGS. 8 to 10 are flowcharts representing methods which may be carried out by the FIG. 5 circuitry.

FIG. 8 is a schematic diagram of a method 600 for use in calibrating the value of the reference voltage signal $V_{REF}$. Thus, method 600 assumes that the DAC R is provided. As above, where the reference voltage signal $V_{REF}$ is configured to have a default (and non-variable) value, the DAC R also need not be provided and the method 600 need not be carried out.

Method 600 comprises steps S602, S603, S604, S605, S606 and S607, and may be carried out by the adjustment circuit 320.

At step S602, the digital engine 324 controls the switch controller 326 to set the gate signals GA to GE such that field-effect transistor SE is ON and field-effect transistors SA to SD are OFF. Thus, the given current $I_{REF}$ is again carried by the switch unit 10E.

At step S603, the digital engine 324 provides the DACs R and E with default (digital) values, e.g., midscale values, so that the variable impedance $R1_E$, $R2_E$ adopts a default resistance value and the reference voltage signal $V_{REF}$ similarly adopts a default value. The digital engine 324 also provides the DAC I with its calibrated value, assuming that method 400 has been carried out, so that the given current $I_{REF}$ is the same as the calibrated current $I_{CAL}$.

At step S604, the comparator 322 is employed to compare the reference voltage signal $V_{REF}$ with the measurement voltage $V_M$, which relates to the switch unit 10E since the other switch units are OFF. An output comparison-result signal is provided from the comparator 322 to the digital engine 324 as indicated so that it can determine if the reference voltage signal $V_{REF}$ is the same as the measurement voltage $V_M$. If the reference voltage signal $V_{REF}$ is not the same as the measurement voltage $V_M$ (S605, NO), the method 600 proceeds to step S606 where the digital engine 324 adjusts the digital value provided to the DAC R, based on the comparison-result signal from the comparator 322, to bring the voltage signal $V_{REF}$ closer to the measurement voltage $V_M$. Steps S604, S605, NO and S606 are then repeated until the reference voltage signal $V_{REF}$ is the same as the measurement voltage $V_M$ (S605, YES), for example to one 1LSB change in the DAC R, in which case the method 600 proceed to step S607.

In step S607, the existing digital value provided to the DAC R is set or recorded as being the calibrated DAC R value, i.e. which causes the reference voltage signal $V_{REF}$ to be the same as the measurement voltage $V_M$. In this way, the reference voltage signal $V_{REF}$ may be taken to have a calibrated value.

Figure 9:
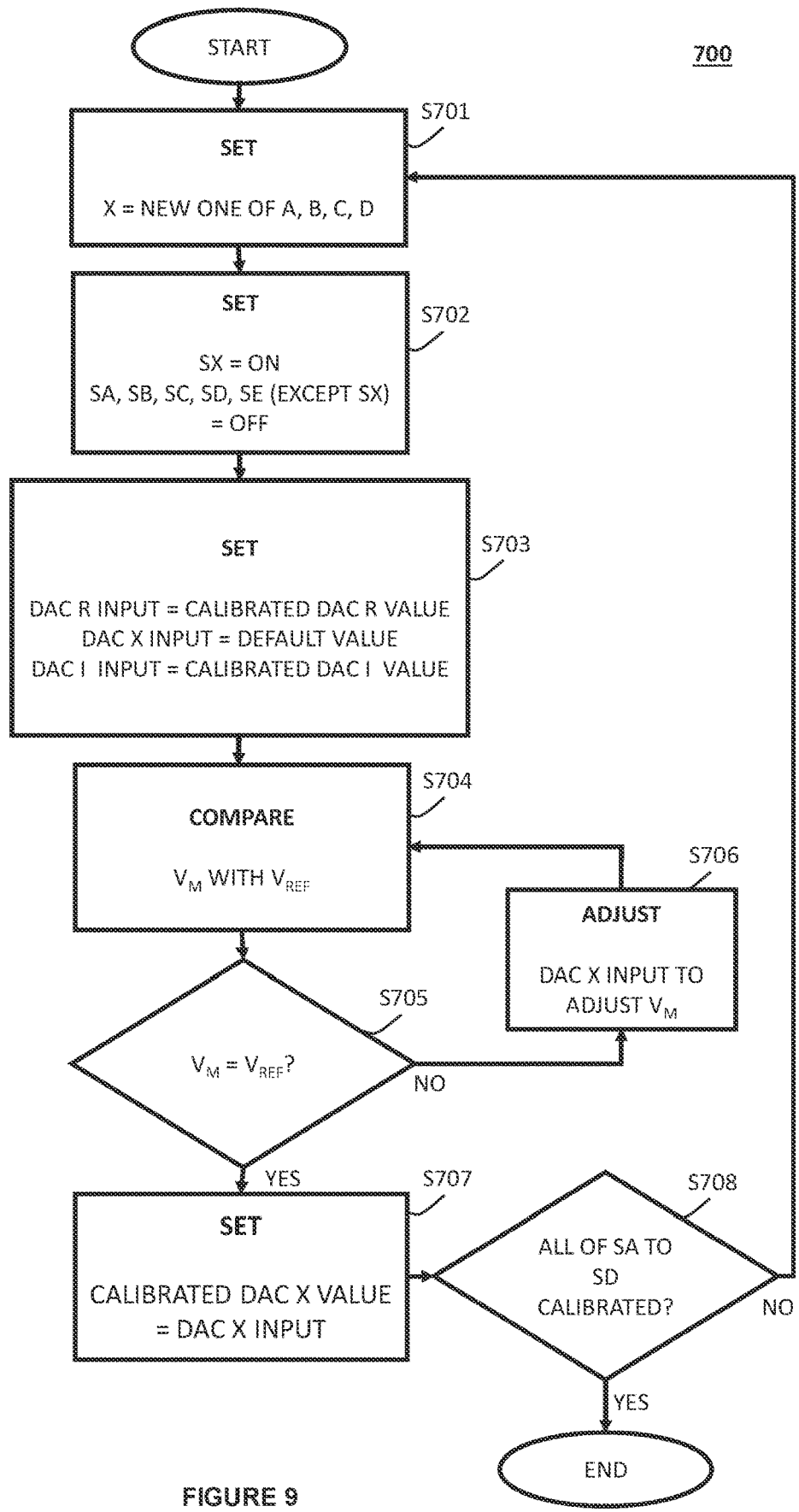

FIG. 9 is a schematic diagram of a method 700 for use in calibrating one or all of the switch units 10A to 10D. Method 700 comprises steps S701 to S708, and may be carried out by the adjustment circuit 320.

At step S701, the digital engine 324 sets the value of a variable X to any one of A, B, C and D, to enable the switch units 10A to 10D to be calibrated one-by-one. Of course, if only one of the switch units is to be calibrated the variable X may be fixed accordingly. For convenience of explanation, it will be assumed that all of the switch units 10A to 10D are to be calibrated, and that, in the first instance of step S701, the digital engine 324 sets the value of a variable X to A (to calibrate switch unit 10A first), and the first pass through steps S702 to S708 will be described accordingly.

At step S702, the digital engine 324 controls the switch controller 326 to set the gate signals GA to GE such that field-effect transistor SA is ON and field-effect transistors SE and SB to SD are OFF. Thus, the given current $I_{REF}$ is carried by the switch unit 10A.

At step S703, the digital engine 324 provides the DACs R and I with their calibrated values, assuming that methods 400 and 600 have been carried out, so that the reference voltage signal $V_{REF}$ has its calibrated value and the given current $I_{REF}$ is the same as the calibrated current $I_{CAL}$. The digital engine 324 also provides the DAC A with a default (digital) value, e.g., a midscale value, so that the variable impedance $R1_A$, $R2_A$ adopts a default resistance value.

At step S704, the comparator 322 is employed to compare the measurement voltage $V_M$ (which relates to the switch unit 10A since the other switch units are OFF) with the reference voltage signal $V_{REF}$. An output comparison-result signal is provided from the comparator 322 to the digital engine 324 as indicated so that it can determine if the measurement voltage $V_M$ is the same as the reference voltage signal $V_{REF}$. If the measurement voltage $V_M$ is not the same as the reference voltage signal $V_{REF}$ (S705, NO), the method 700 proceeds to step S706 where the digital engine 324 adjusts the digital value provided to the DAC A, based on the comparison-result signal from the comparator 322, to bring the measurement voltage $V_M$ closer to the voltage signal $V_{REF}$. Steps S704, S705, NO and S706 are then repeated until the measurement voltage $V_M$ is the same as the reference voltage signal $V_{REF}$ (S705, YES), for example to one 1LSB change in the DAC A, in which case the method 700 proceed to step S707.

In step S707, the existing digital value provided to the DAC A is set or recorded as being the calibrated DAC A value, i.e., which causes the predetermined property of the switch unit 10A to have a calibrated value, and to be the same as that of the switch unit 10E.

The method then proceeds to step S708, where it is checked to see if the the predetermined properties of all of the field-effect transistors SA to SD (i.e. of all of the switch units 10A to 10D) that are intended to be calibrated have been calibrated. If not (S708, NO), the method returns to step S701 where the digital engine 324 sets the value of variable X to a new one of A, B, C and D, and then passes through steps S702 to S708 again. For example, for the second pass through steps S702 to S708 the value of the variable may be set to B, with it being set to C and then D for third and fourth passes, respectively. Once all of the switch units 10A to 10D that are intended to be calibrated have been calibrated (S708, YES), the method ends.

In this way, the method 700 may obtain calibrated values for the DACs B to D (as well as for DAC A) which cause the predetermined properties of all of the field-effect transistors SA to SD (i.e. of all of the switch units 10A to 10D) to have calibrated values, and to be the same as one another (within the 1LSB DAC accuracy) and as that of the calibrated field-effect transistor SE (i.e. the switch unit 10E).

Figure 10:
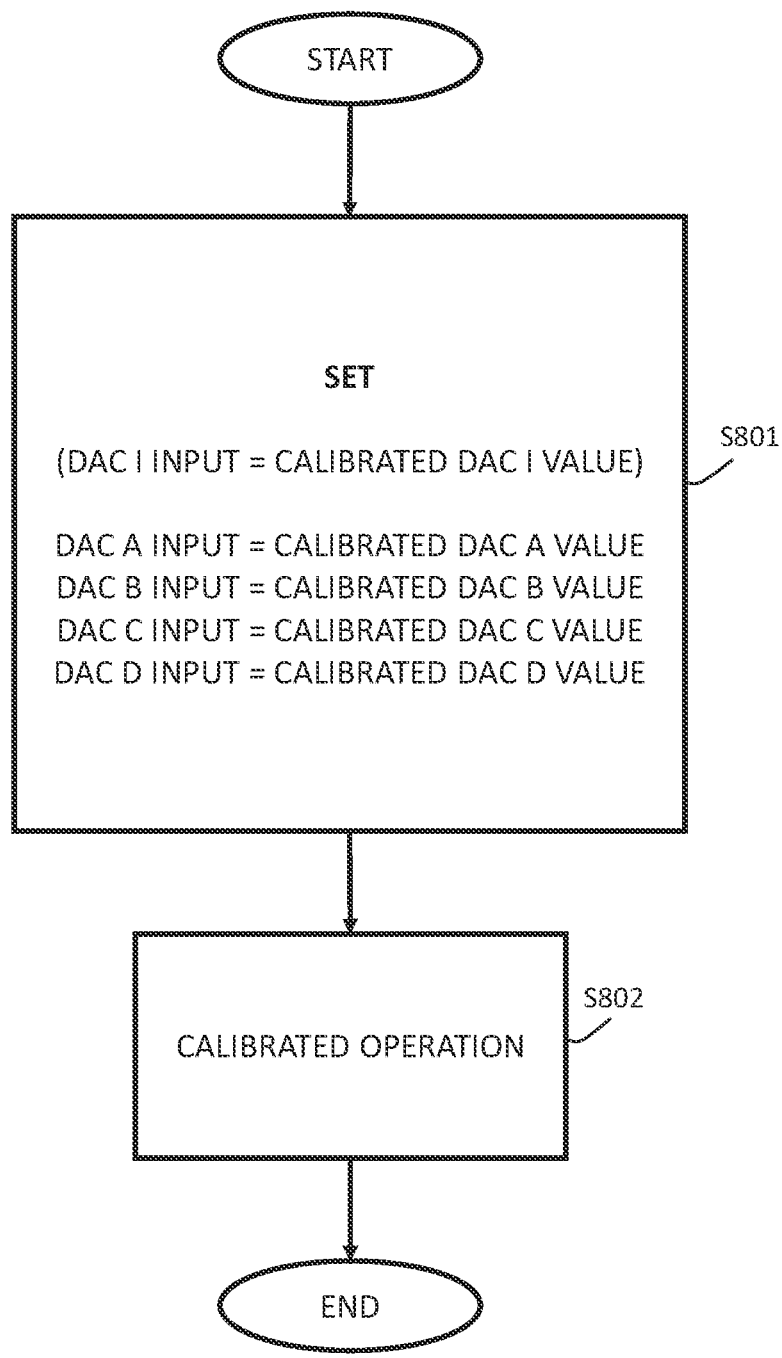

FIG. 10 is a schematic diagram of a method 800 for use in configuring the current-mode circuit 300 for calibrated operation. Method 800 comprises steps S801 and S802 and may be carried out by the adjustment circuit 320.

At step S801, the digital engine 324 provides the DACs A to D with their calibrated values, so that the predetermined properties of all of the field-effect transistors SA to SD (i.e. of all of the switch units 10A to 10D) have their calibrated values, and are the same as one another (within the 1LSB DAC accuracy). The DAC I is also provided with its calibrated value assuming that method 400 has been carried out.

At step S802, which corresponds to calibrated operation, the digital engine 324 controls the switch controller 326 to control the gate signals GA to GD so that the current-mode circuit 300 carries out its intended function. For example, when the current-mode circuit 300 is for use with a DAC in line with the differential switching circuit (or current-mode circuit) of FIG. 2, the gate signals GA to GD may be controlled by a thermometer-coded signal (dependent on data supplied to the DAC) so that when one of the field-effect transistors SA to SD is ON, the others are OFF, and so that from each clock cycle to the next (in synchronisation with which the gate signals change state), the field-effect transistor which is ON turns OFF and one of the field-effect transistors which are OFF turns ON, so that any distortion generated by the switching is data independent.

Looking back to FIG. 5, it is recalled that the calibrated current source 340 provides a calibrated current $I_{CAL}$. The calibrated current source 340 may itself be calibrated, to calibrate the calibrated current $I_{CAL}$, by virtue of a technique disclosed in EP3618282$_A$1, the entire contents of which are incorporated herein by reference.

The technique disclosed in EP3618282A1 enables a plurality of output current sources with (currents having) different magnitudes to be calibrated, so that the relationship in magnitude between (the currents of) each output current source is calibrated as well. The technique involves using a reference or 'golden' current source to calibrate a plurality of candidate current sources, and then using this plurality of candidate sources to further calibrate output current sources for use in specific applications. For example, one of those output current sources (once calibrated) may be used as the calibrated current source 340.

Figure 11:
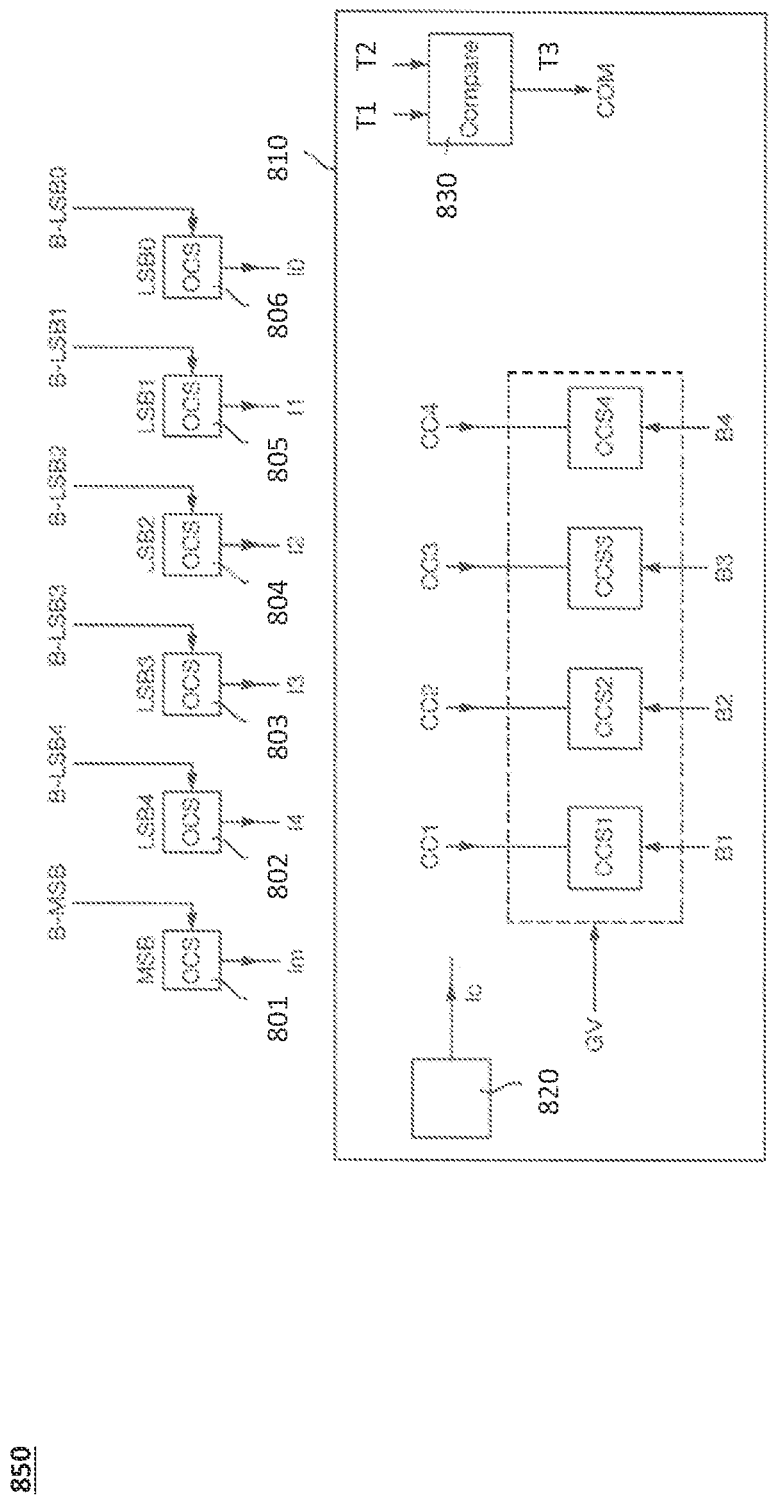
FIG. 11 is a schematic diagram of calibration circuitry useful for calibrating the calibrated current $I_{CAL}$ of FIG. 5 itself.

FIG. 11 is a schematic diagram of calibration circuitry 850, being a simplified version of the calibration circuitry 300 of FIG. 5 of EP3618282A1. For simplicity of explanation, a single 'golden' current source 820, four candidate current sources CCS1 to CCS4 and output current sources OCS 801 to 806 will be considered. As described in EP3618282A1, any number of candidate current sources or output current sources may be used.

In the following example, it is assumed that each output current source should output a current that is four times as large as the next output current source i.e., with the first output current source OCS 801 having an output current Im that is four times as large as the second output current I4 from a second output current source OCS 802 and so on and so forth. Such an application may be of use in a segmented DAC. This may be summarized as follows:

$Im=4*I4=16*I3=64*I2=256*I1=1024*I0$.

In the present example, the four candidate current sources CCS1 to CCS4, each outputting a candidate current CC1 to CC4 respectively, are firstly calibrated against the 'golden' current source 820, outputting golden current Ic. This is achieved by sequentially comparing each candidate current source with the 'golden' current source using comparator circuitry 830. Comparator circuit 830 may be configured the same as comparator circuitry 330, and operate in a similar manner, so that duplicate description may be omitted.

The control signal COM output by the comparator circuitry 330 may be used to adjust the candidate currents output by each candidate current source. For example, candidate current source CCS1 outputs candidate current CC1 which may be compared with 'golden' current IC. Candidate current source CCS1 may then be adjusted by virtue of its control signal B1 (which may be a signal for controlling a variable impedance R where the current sources are implemented as switch units in line with the switch units 10 described earlier herein), using the control signal COM, such that the candidate current CC1 and the 'golden' current Ic are substantially equal. This process may be repeated for each candidate current source in turn.

Next, a first output current source OCS 801 is calibrated. The four calibrated candidate current sources CCS1 to CCS4 are summed by connecting their outputs together and are collectively compared to the first output current Im of the first output current source OCS 801 (i.e. CC1+CC2+CC3+ CC4 is compared with Im). The first output current source OCS 801 is configured, in this example, to have an output current Im of 4*Ic, that is four times the 'golden' current. The first output current source OCS 801 is adjusted by virtue of its control signal B-MSB using the control signal COM output by the comparator circuitry 330 until the first output current Im and the combined candidate currents (CC1+ CC2+CC3+CC4) are substantially equal. Again, the control signal B-MSB may be a signal for controlling a variable impedance R where the current source OCS 801 is implemented as a switch unit in line with the switch units 10 described earlier herein.

Next, in order to calibrate the remaining output current sources, the second output current I4 of a second output current source OCS 802 is compared to the current of a single candidate current source (e.g. CC1), and adjusted until the currents I4 equals that current CC1. This results in the second output current I2 having a magnitude ¼ of that of the first output current Im, since only one of the four candidate currents is used for the comparison. The output COM of the comparator circuitry 330 is used as the control signal based on which the control signal B-LSB4 of the second output current source OCS 802 is adjusted until the second output current I4 is substantially equal to the candidate current CC1.

Next, the calibrated second output current I4 is compared to the sum of all four candidate currents (i.e. CC1+CC2+ CC3+CC4 is compared with I4). However, this time, the output COM of the comparator circuitry 330 is used as the basis for adjusting the candidate current sources collectively, via a collective control signal input GV (which may be a gate voltage signal), such that their combination is substantially equal to the calibrated second output current I4. This step effectively reduces the magnitude of the candidate currents by a factor of four, since the calibrated second output current I4 was previously made substantially equal to only one candidate currents.

Similar steps are then undertaken for the remaining output current sources.

For example, the third output current I3 from the third output current source OCS 803 is compared to a single candidate current (i.e. CC1) and the control signal B-LSB3 adjusted until I3=CC1. Once substantially equal, the calibrated third output current I3 is compared to the sum of all four candidate currents (i.e. CC1+CC2+CC3+CC4 is compared with I3), and the candidate current sources are collectively adjusted using collective control input GV, so that their sum is substantially equal to the calibrated third output current I3. This, again, effectively reduces the magnitude of the candidate currents by a factor of four since the calibrated third output current I3 was previously made substantially equal to only one candidate current.

In a similar manner, I2, I1 and I0 may be calibrated. The result is calibrated output currents with a defined relationship (1:4) one to the next. As above, any one of the calibrated output current sources may be used as the calibrated current source 340.

As mentioned earlier, the use of the impedances R in the switch units 10 enables calibration of the switches (field-effect transistors) S without for example needing to control a gate or bulk voltage. This technique has particular application where the field-effect transistors S are FinFET transistors, i.e. fin field-effect transistors. Instead of controlling the Vth of the switch transistors S through their bulk, the calibration of mismatch between clock switches S (see FIG. 5) is achieved through regulating the tail voltage Vm of the switch S with a voltage-controlled resistor R1, R2. In the case of a DAC having multiple DAC slices (each corresponding to FIG. 5, and to a current source 2 and differential switching circuit 4 pair in FIG. 1), clock switches S of each DAC slice may be calibrated by comparing the tail voltage Vm of the slice versus the adjusted reference tail voltage $V_{REF}$ for that slice using a dedicated calibration DAC (e.g. DAC A in FIG. 5 for switch SA). This may be carried out until the tail voltage Vm for the switch S concerned (e.g. SA) becomes equal to adjusted tail reference voltage $V_{REF}$ within 1LSB precision in the calibration DAC (e.g. DAC A). Effectively the overall resistance R1, R2 (for each switch S) is adjusted to compensate for the mismatch on the switches S. The digital calibration engine 324 may determine whether to increment or decrement the calibration DAC (e.g. DAC A, for switch SA) in binary search method to find the right calibration code until the tail voltage Vm of that switch S becomes equal to adjusted tail reference voltage $V_{REF}$ within 1LSB precision. This calibration across the switches SA to SD reduces switching delay mismatch and in turn improves the linearity of the overall DAC.

Figure 12:
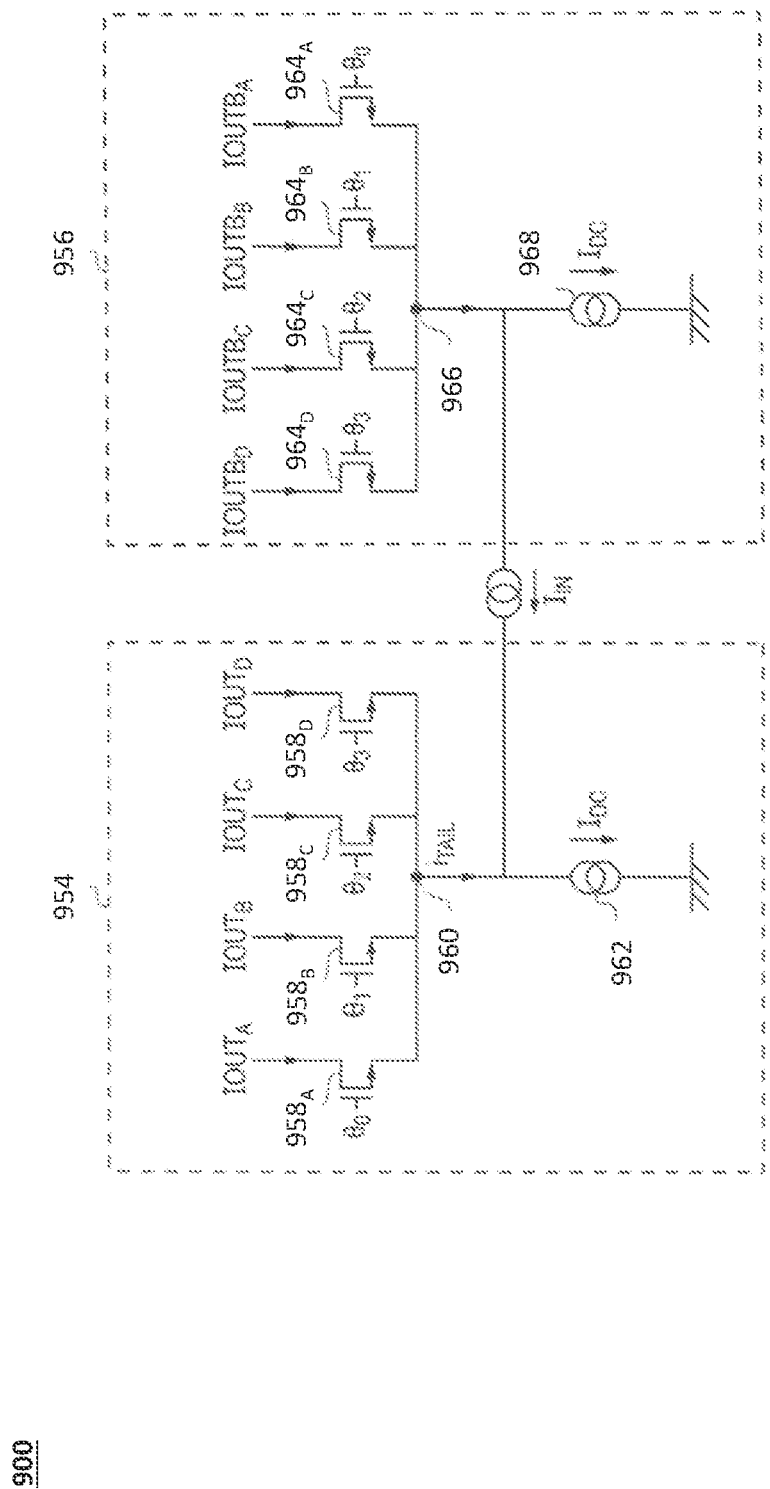
FIG. 12 is a schematic circuit diagram of a current-mode (current-steering) sampler, useful for understanding embodiments of the present invention as applied to ADC circuitry.

Incidentally, although the current-mode circuits have been described herein in relation to DAC functionality, it will be appreciated that they may also be used within an ADC. FIG. 12 is a schematic circuit diagram of a four-phase (i.e. multiphase) current-mode (current-steering) sampler 900, which corresponds to the sampler 42 of FIG. 10 of EP-A1-2211468, the entire contents of which are incorporated herein by reference. The sampler forms the front-end of an ADC.

The sampler 900 is configured to receive a differential input current signal, modeled as a current source IN whose magnitude varies with the input signal. For differential signaling, sampler 900 effectively has two matching (or corresponding or complementary) sections 954 and 956 for the two differential inputs. Accordingly, there is a first set of output streams $IOUT_A$ to $IOUT_D$ in section 954 and a second set of matching output streams $IOUTB_A$ to $IOUTB_D$ in section 954, where IOUTB means $\overline{\text{IOUT}}$, and wherein IOUT$_A$ is paired with IOUTB$_A$, IOUTB is paired with IOUTB$_B$, and so on and so forth.

Focusing on the first section 954 by way of example (because the second section 956 operates analogously to the first section 54), there are provided four n-channel FETs 958$_A$ to 958$_D$ (i.e. one per stream or path) with their source terminals connected together at a common tail node 960.

The aforementioned current source I$_{IN}$ is connected between common tail node 960 and an equivalent common tail node 966 of section 56. A further current source I$_{DC}$ 962 is connected between the common tail node 960 and ground supply, and carries a constant DC current Ioc. The gate terminals of the four transistors 958$_A$ to 958$_D$ are driven by four clock signals θ$_0$ to θ$_3$, respectively, provided from a VCO (not shown). As mentioned above, section 56 is structurally similar to section 54 and thus comprises transistors 964A to 964$_D$, common tail node 966 and current source I$_{DC}$ 968.

The clock signals θ$_0$ to θ$_3$ are assumed to be time-interleaved raised cosine waveforms provided as four voltage waveforms from the VCO. The use of four clock signals in the present case is due to a four-way-interleaving design of ADC circuitry described in more detail in EP-A1-2211468, but it will be appreciated that this is not essential.

Clock signals θ$_0$ to θ$_3$ are 90° out of phase with one another, such that θ$_0$ is at 0° phase, θ$_1$ is at 90° phase, θ$_2$ is at 180° phase, and θ$_3$ is at 270° phase. The effect of sampling circuitry 900, under control of clock signals θ$_0$ to θ$_3$, is that the output currents IOUT$_A$ to IOUT$_D$ are four trains (or streams) of current pulses, the series of pulses in each train having the same period as one of the clock signals θ$_0$ to θ$_3$, and the pulses of all four trains together being time-interleaved with one another as an effective overall train of pulses at a quarter of the period of one of the clock signals (or at four times the sampling frequency of one of the clock signals).

By comparing the current-mode circuit 300 with, for example, the first section 954, it will be understood that each of the field-effect transistors 958$_A$ to 958$_D$ may be replaced by a switch unit corresponding to switch unit 10A, and that the tail node 960 may serve as a measurement node M for use with the adjustment circuit 320. Thus, such switch units may be calibrated using the techniques described earlier herein. The second section 956 may be configured and calibrated in a similar fashion. Such an arrangement embodies the present invention.

Figure 13:
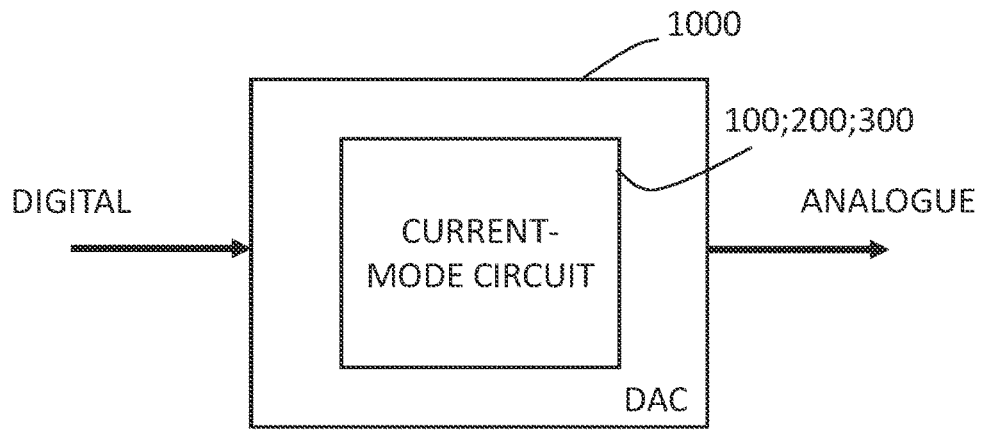
FIG. 13 is a schematic diagram of a DAC embodying the present invention.

FIG. 13 is a schematic diagram of a DAC 1000 embodying the present invention. The DAC 1000 comprises any of the current-mode circuits 100, 200, 300 disclosed herein (including a modified version of the sampler 900 as described above). The DAC 1000 may output an analogue signal, as shown, based on an input digital signal.

Figure 14:
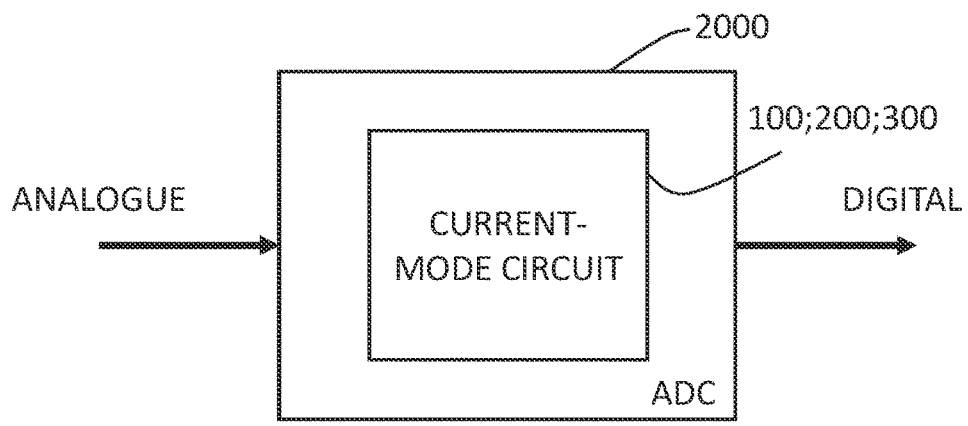
FIG. 14 is a schematic diagram of an ADC embodying the present invention.
Figure 15:
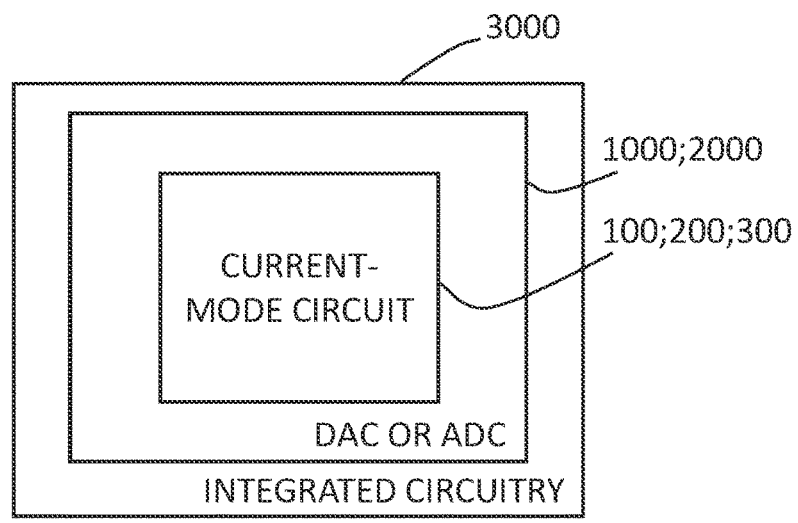
FIG. 15 is a schematic diagram of integrated circuitry embodying the present invention.

FIG. 14 is a schematic diagram of an ADC 2000 embodying the present invention. The ADC 2000 comprises any of the current-mode circuits 100, 200, 300 disclosed herein (including a modified version of the sampler 900 as described above). The ADC 2000 may output a digital signal, as shown, based on an input analogue signal.

Any of the circuitry disclosed herein may be implemented as integrated circuitry or as an integrated circuit, for example as (or as part of) and IC chip, such as a flip chip. FIG. is a schematic diagram of integrated circuitry 3000 embodying the present invention. The integrated circuitry 3000 may comprise the DAC 1000 and/or the ADC 2000 and/or any of the current-mode circuits 100, 200, 300 disclosed herein (including a modified version of the sampler 900 as described above).

Integrated circuitry 3000 may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above aspects, the various features may be implemented in hardware, or as software modules running on one or more processors/computers.

The invention also provides a computer program or a computer program product comprising instructions which, when executed by a computer, cause the computer to carry out any of the methods/method steps described herein, and a non-transitory computer-readable medium comprising instructions which, when executed by a computer, cause the computer to carry out any of the methods/method steps described herein. A computer program embodying the invention may be stored on a non-transitory computer-readable medium, or it could, for example, be in the form of a signal such as a downloadable data signal provided from an Internet website, or it could be in any other form.

The present invention may be embodied in many different ways in the light of the above disclosure, within the spirit and scope of the appended claims.

The invention claimed is:

1. A current-mode circuit, comprising:
   a plurality of switch units, each of the plurality of switch units comprising a field-effect transistor connected in series with an impedance and configured to carry a given current, wherein for each of the plurality of switch units or for at least one of the plurality of switch units the impedance is a variable impedance;
   an adjustment circuit configured, for each of the plurality of switch units or for the at least one of the plurality of switch units, to adjust an impedance of the variable impedance to calibrate a predetermined property of that switch unit which is dependent on the field-effect transistor;
   a shared current source; and
   a shared measurement node,
   wherein:
   for each of the plurality of switch units, a serial connection of the field-effect transistor and the impedance is further connected in series with the shared current source, the shared current source defining the given current, a node between the serial connection and the shared current source being the shared measurement node, and a voltage at the shared measurement node being a measurement voltage, and
   the adjustment circuit comprises a comparator configured, for each of the plurality of switch units or for the at least one of the plurality of switch units, to compare the measurement voltage with a reference voltage, and configured to adjust the impedance of the variable impedance concerned based on the comparison to bring the measurement voltage into or towards a target relationship with the reference voltage.

2. The current-mode circuit as claimed in claim 1, wherein, for each of the plurality of switch units or for the at least one of the plurality of switch units:
   the variable impedance comprises a first resistor connected in parallel with a second resistor, the second resistor being a variable resistor; and the adjustment circuit is configured to adjust the resistance of the variable resistor to calibrate the predetermined property.

3. The current-mode circuit as claimed in claim 2, wherein, for each of the plurality of switch units or for the at least one of the plurality of switch units:
the first resistor comprises a polysilicon resistor or a diffusion resistor, and optionally is a fixed-resistance resistor; and/or
the variable resistor comprises a calibration transistor.

4. The current-mode circuit as claimed in claim 3, wherein the first resistor has a resistance of X ohms and the second resistor is controllable to have a resistance within a defined range of resistances, wherein:
a mid-range resistance of the defined range of resistances is Y ohms, where $5 \leq Y/X \leq 20$, or where $10 \leq Y/X \leq 14$; or
the range of resistances is approximately from 5.X ohms to 25.X ohms, or approximately from 6.X ohms to 20.X ohms.

5. The current-mode circuit as claimed in claim 2, wherein, for each of the plurality of switch units or for the at least one of the plurality of switch units:
the adjustment circuit comprises a digital-to-analogue converter connected to control the variable resistor dependent on a digital input signal, and
the adjustment circuit is configured to control the digital input signal for the digital-to-analogue converter concerned to adjust the resistance of the variable resistor.

6. The current-mode circuit as claimed in claim 1, wherein the adjustment circuit is configured to:
for each of the plurality of switch units, measure the predetermined property; and
for each of the plurality of switch units or for the at least one of the plurality of switch units, adjust the impedance of the variable impedance so as to adjust the measured property to or towards a reference value.

7. The current-mode circuit as claimed in claim 6, wherein, for each of the plurality of switch units:
the given current has a defined value, and
the predetermined property is a potential difference comprising a sum of its gate-source voltage and a potential difference across its series-connected impedance, optionally when the field-effect transistor is provided with a gate voltage having a defined ON voltage level to turn it ON.

8. The current-mode circuit as claimed in claim 1, wherein, for each of the plurality of switch units or for the at least one of the plurality of switch units, the target relationship is that a ratio between the measurement voltage and the reference voltage is substantially a predetermined ratio and/or that the measurement voltage and the reference voltage are substantially equal.

9. The current-mode circuit as claimed in claim 1, wherein:
the reference voltage is the same for all of the plurality of switch units, and the adjustment circuit is configured, for each of the plurality of switch units, to adjust the impedance of the variable impedance concerned based on the comparison to bring the measurement voltage into or towards the target relationship with the reference voltage; or
the reference voltage for the at least one of the plurality of switch units is the measurement voltage for another one of the plurality of switch units, and the adjustment circuit is configured, for the at least one of the plurality of switch units, to adjust the impedance of its variable impedance based on the comparison to bring its measurement voltage into or towards the target relationship with its reference voltage.

10. The current-mode circuit as claimed in claim 9, wherein:
the adjustment circuit is configured to control the gate voltages of the field-effect transistors to selectively have ON voltage levels to selectively turn them ON to carry their given currents, and
the given currents and/or the ON voltage levels are the same for all of the plurality of switch units.

11. The current-mode circuit as claimed in claim 9, wherein:
the adjustment circuit is configured:
to control the gate voltages of the field-effect transistors to turn them ON one-by-one in turn so that the shared current source defines the given current for one of the plurality of switch units whose field-effect transistor is ON; and
whilst the field-effect transistor for each of the plurality of switch units or for the at least one of the plurality of switch units is ON, to adjust the impedance of the variable impedance of that switch unit.

12. A digital-to-analogue converter or an analogue-to-digital converter, comprising the current-mode circuit of claim 1.

13. Integrated circuitry, comprising the digital-to-analogue converter or the analogue-to-digital converter of claim 12.

14. Integrated circuitry, comprising the current-mode circuit of claim 1.

15. A current-mode circuit, comprising:
one or more switch units, each of which comprises a field-effect transistor connected in series with an impedance and is configured to carry a given current, wherein for at least one of the one or more switch units the impedance is a variable impedance; and
an adjustment circuit configured, for the at least one of the one or more switch units, to adjust an impedance of the variable impedance to calibrate a predetermined property of the at least one of the one or more switch units which is dependent on the field-effect transistor,
wherein, for the at least one of the one or more switch units:
the variable impedance comprises a first resistor connected in parallel with a second resistor, the second resistor being a variable resistor; and
the adjustment circuit is configured to adjust the resistance of the variable resistor to calibrate the predetermined property,
wherein, for the at least one of the one or more switch units:
the first resistor comprises a polysilicon resistor or a diffusion resistor; and/or
the variable resistor comprises a calibration transistor, and
wherein the first resistor has a resistance of X ohms and the second resistor is controllable to have a resistance within a defined range of resistances, wherein:
a mid-range resistance of the defined range of resistances is Y ohms, where $5 \leq Y/X \leq 20$, or where $10 \leq Y/X \leq 14$; or
the range of resistances is approximately from 5.X ohms to 25.X ohms, or approximately from 6.X ohms to 20.X ohms.

16. A current-mode circuit, comprising:
one or more switch units, each of which comprises a field-effect transistor connected in series with an impedance and is configured to carry a given current, wherein for at least one of the one or more switch units the impedance is a variable impedance; and an adjustment circuit configured, for the at least one of the one or more switch units, to adjust an impedance of the variable impedance to calibrate a predetermined property the at least one of the one or more switch units which is dependent on the field-effect transistor, wherein the adjustment circuit is configured to:

for each of the one or more switch units, measure the predetermined property; and for the at least one of the one or more switch units, adjust the impedance of the variable impedance so as to adjust the measured property to or towards a reference value, and wherein, for each switch unit:
   the given current has a defined value; and
   the predetermined property is a potential difference comprising a sum of its gate-source voltage and a potential difference across its series-connected impedance.

\* \* \* \* \*